United States Patent [19]

Shibata

[11] 3,758,943

[45] Sept. 18, 1973

[54] METHOD FOR MANUFACTURING SEMICONDUCTOR DEVICE

[75] Inventor: Keizo Shibata, Yokohama-shi, Japan

[73] Assignee: Tokyo Shibaura Electric Co. Ltd, Kawasaki-shi, Japan

[22] Filed: Nov. 18, 1971

[21] Appl. No.: 200,155

Related U.S. Application Data

[62] Division of Ser. No. 878,002, Nov. 19, 1969, abandoned.

[30] Foreign Application Priority Data

Nov. 22, 1968 Japan .......................... 43/85199

[52] U.S. Cl. ....................... 29/578, 29/580, 29/590, 29/591

[51] Int. Cl. ............................................. B01j 17/00

[58] Field of Search ...................... 29/578, 580, 590, 29/591; 148/187; 156/17

[56] References Cited

UNITED STATES PATENTS

| | | | |
|---|---|---|---|
| 3,567,506 | 3/1971 | Belardi | 29/578 |
| 3,237,271 | 3/1966 | Arnold et al. | 29/578 |
| 3,635,767 | 1/1972 | Tsuchimoto | 148/187 |

*Primary Examiner*—Charles W. Lanham
*Assistant Examiner*—W. Tupman
*Attorney*—Flynn & Frishauf

[57] ABSTRACT

A method for manufacturing a semiconductor device comprises forming a first region of one conductivity type in a substrate of an opposite conductivity type through a main surface of the substrate, depositing a first metal electrode layer on the first region and depositing an insulation film on the first electrode layer. The insulation film is etched over the first region with a plurality of relatively minute holes to expose the first metal electrode layer through the holes and the first metal electrode layer is etched with a plurality of holes to expose the first region through said holes, the holes in the first metal electrode layer being etched such that the holes of the first metal electrode layer are larger than that of the insulation film. A second region is formed in the first region through the holes of the first metal electrode layer and insulation film. The second region is of opposite conductivity to the first region. A second metal electrode layer is formed on the insulation film so as to electrically connected to each exposed section of the second region through the holes of the first metal electrode layer and insulation film.

4 Claims, 29 Drawing Figures

METHOD FOR MANUFACTURING SEMICONDUCTOR DEVICE

This is a continuation, division, of application Ser. No. 878,002, filed November 19, 1969 now abandoned.

The present invention relates to a semiconductor device and more particularly to a semiconductor device used as a transistor adapted for high frequency applications.

The process is known of forming regions in a semiconductor substrate by introducing impurities displaying a desired type of conductivity in part of the surface of the substrate by diffusion or the ion implantation process of bringing ionized impurities into the substrate at an accelerated speed. It is also well known that particularly with a high frequency semiconductor device, the area of a region formed in a semiconductor substrate by introduction of said impurities and the distance between an electrode connected to said region and another electrode connected to a different region adjacent to said region in opposite conductivity thereto have a great bearing on the properties of a semiconductor device such as power gain and noise figure. For example, power gain in a transistor is associated with the time constant of an emitter region defined by the time required for electrons to travel through the emitter region, and the time constant of the emitter region is related to its capacity, which in turn is determined by its area. That is, the smaller the area, the more reduced the capacity, and the smaller the capacity, the greater the power gain. Thsu it is demanded that the area of an emitter region be as small as possible in order to increase power gain.

The noise figure is related to the spreading resistance of a base region. The more reduced said resistance, the more improved said noise figure. The spreading resistance of the base region is expressed as a sum of the resistance of the base region prevailing between the centre and periphery of the emitter region, namely, an internal base resistance, and the resistance of the base region prevailing between the periphery of the emitter region and the base electrode, namely, an external base resistance. If, therefore, the internal base rsistance is reduced by decreasing the area of the emitter region and the external base resistance is also minimized by narrowing the distance between the base electrode and the periphery of the emitter region, namely, between the base electrode and the emitter electrode, then the spreading resistance of the base region will be decreased with the resultant improvement of the noise figure.

Further, division of an emitter region into a plurality of small sections will lead to a greater ratio of the overall peripheral length of the emitter region as a whole to its overall area, and in consequence an elevated carrier injection efficiency. The resultant decrease in the aforementioned external base resistance and the area of the emitter region will improve the power gain and noise figure.

Accordingly, the prior art method of manufacturing a high frequency transistor has been so designed as to decrease the area of the emitter region as much as possible, broaden the ratio of its peripheral length to its area and narrow the distance between the emitter electrode and base electrode.

To meet such requirements, there has heretofore been practised the process of providing a square or rectangular base region in part of a semiconductor substrate and forming an emitter region therein by dividing it into a plurality of juxtaposed narrow sections. According to this process, there is formed an emitter electrode on each of the divided emitter sections, in a manner extend on to an insulation film to one side of the aforementioned square or rectangular base region. And there is formed a base electrode on that part of the base region which lies between the two adjacent ones of the divided emitter sections in a manner to extend on the same insulation film on which the emitter electrode is disposed to the opposite side of said square or rectangular base region.

Where there is manufactured such a transistor, it has been customary practice to form both base and emitter regions by selective diffusion of impurities. When, for said selective diffusion, there are perforated mask holes in a layer of silicon dioxide or surface stabilizing agent formed on the surface of a semiconductor substrate, said perforation is carried out by the known photo etching technique. This technique is also employed in depositing an electrode in the prescribed form on the aforesaid base and emitter regions for connection therewith.

In the case of photo etching, contraction of the size of the respective regions of a transistor and in consequence that of the electrode formed thereon in order to meet the aforementioned requirements is subject to certain limitations from the standpoint of ensuring the accurate alignment of the electrode with a mask hole perforated in the insulation layer on the respective regions. Namely, it is difficult to form by vapour deposition an electrode layer of electrically conductive metal exactly in each minute mask hole formed in the $SiO_2$ film in order to provide said electrode for the respective regions. Displacement of the electrode from said hole sometimes causes, for example, the base and emitter regions to be shorted with each other by said electrode, so that there have heretofore been presented difficulties in reducing the area of each divided emitter section and the distance between the electrodes formed thereon to a fully desired extent.

With a transistor wherein there are formed within the base region a plurality of, for example, five or six, juxtaposed narrow emitter regions and there is deposited a base electrode on that part of the base region which lies between the two adjacent ones of said juxtaposed emitter regions, the width of each emitter region is limited to 2 or 3 microns and the distance between the emitter and base electrodes similarly to 2 or 3 microns. However, such limitation has prevented a transistor from fully displaying high frequency properties. Further, since each emitter region of a transistor having the aforementioned arrangement is appreciably narrow, part of the holes through which there is to be deposited an emitter electrode is not fully etched, so that the subsequently formed electrode does not contact the whole of the corresponding emitter region. If, therefore, there is employed a transistor under the condition where one of several juxtaposed narrow emitter regions formed within the base region is not connected to the corresponding emitter electrode, then it will largely affect the properties of said transistor.

It is accordingly the object of the present invention to provide a semiconductor device adapted for high frequency application and a method for manufacturing the same. More particularly, the invention provides a semiconductor device which is prominently improved in power gain and noise figure.

SUMMARY OF THE INVENTION

According to the present invention there is prepared a semiconductor device in the following manner. To form a first region, there is introduced into part of the surface of a semiconductor substrate of one conductivity type an impurity having an opposite type of conductivity thereto by diffusion or ion implantation using, for example, the known masking technique. There is vapor deposited a first metal electrode layer on the surface of at least said first region and then an insulation film on said first metal electrode layer. In that portion of said insulation film which is formed on said first region there are perforated a plurality of minute holes by the photo etching technique. In said first metal electrode layer are etched holes using the insulation film perforated with said minute holes as a mask. There is introduced into said first region an impurity having an opposite type of conductivity thereto by diffusion or ion implantation through the holes formed in said insulation film and first metal electrode layer so as to form a second region consisting of a plurality of divided minute sections. The holes initially formed in said first metal electrode layer are bored to a larger size by etching so as to further remove said first metal electrode layer from the proximity of each of the divided sections of said second region. When there is vapour deposited a second metal electrode layer on said insulation film, then said second metal electrode layer and each section of said second region are electrically connected through the holes formed in said insulation film and first metal electrode layer. Said first and second metal electrode layers are electrically insulated from each other by a void space.

In the case of a transistor, said first region represents a base region and said second region denotes an emitter region, and the semiconductor substrate forms a collector region, as is known.

Since the emitter region is formed within the base region in the form of numerous minute divided sections, the overall peripheral length of the emitter region as a whole is prominently enlarged with respect to its overall area. Accordingly, the area of each divided emitter section is considerably reduced and the interval between each emitter section and base electrode or the interval between said emitter electrode and base electrode is contracted, so that the semiconductor device of the present invention is noticeably improved in power gain and noise figure.

Formation of the second or emitter electrode is effected simply by vapour depositing a metal on the insulation film, thus simplifying the manufacturing process. Further, the emitter region is formed within the base region, as described above, in the form of numerous divided sections, so that if some of said emitter sections should not be used due to the insufficient perforation of holes, the properties of a transistor as a whole will not be substantially affected.

There will now be described a field effect transistor. This transistor comprises a semiconductor substrate of one conductivity type, a first region disposed in said substrate in a lattice form in opposite type of conductivity thereto, a second region consisting of a plurality of minute divided sections and formed in the same type of conductivity as said first region, one end of each of said sections being connected to said first region and the other end being formed adjacent to the surface of the substrate, a first metal electrode layer electrically connected to the surface of the substrate in a manner to surround each section of said second region, an insulation film disposed on said first metal electrode layer in a manner to cover at least said first region and a second metal electrode layer formed on said insulation film and electrically connected to each section of said second region.

The first and second regions jointly form a gate region. The lattice form of said first region enables its overall peripheral length prominently to increase with respect to its area and the channels surrounded by said gate region to be formed in large numbers, so that the transistor of this embodiment is adapted for high frequency application due to the elevated efficiency of modulating drain current with respect to gate voltage and, of course, improved in power gain and noise figure.

This invention can be more fully understood from the following description taken in conjunction with the accompanying drawings, in which:

FIGS. 1 to 10 are schematic sectional views of a semiconductor device according to an embodiment of the present invention, showing the sequential steps of its manufacture; and FIGS. 5A to 7A and FIGS. 5B to 7B respectively show different sets of manufacturing steps;

There will now be described by reference to the appended drawings the method of manufacturing a semiconductor device, particularly a transistor element, according to the present invention.

Figure 1:
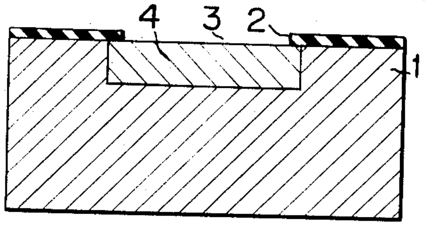

As in the case where there is prepared the prior art planar transistor element, there is formed, for example, a silicon semiconductor substrate 1 of one conductivity type (such as N-type conductivity). On the surface of said substrate is formed a first insulation film 2, for example, a film of silicon dioxide ($SiO_2$) by oxidizing the surface of said substrate 1 or a film of silicon nitride ($Si_3N_4$) by gas phase growth or sputtering. There is formed in the insulation film 2 a hole 3 in a prescribed form by a known photo etching technique to allow part of the surface of the semiconductor substrate to be exposed. Suitable for said etching is a liquid of hydrogen fluoride base. Into the substrate 1 from said exposed portion is introduced, as shown in FIG. 1, an impurity affording an opposite type of conductivity thereto (for example, P-type conductivity) by thermal diffusion or ion implantation so as to form a first or base region 4 to a depth of about 0.8 micron as measured from the surface of the substrate 1. The substrate 1 may of course consist of a high resistivity layer formed by epitaxial growth on a low resistivity layer. In this case, the base region 4 is formed in said epitaxial layer.

While the base region 4 may be formed, as described above, by diffusion or ion implantation, said region 4 is prepared, in case of diffusion, slightly larger than the area of the hole 3 perforated in the insulation film as is customarily practised. On the other hand, in the case of ion implantation, the base region is so formed as to have substantially the same area as the hole 3. Therefore, FIG. 1 represents the case where the base region is formed by diffusion.

Figure 2:
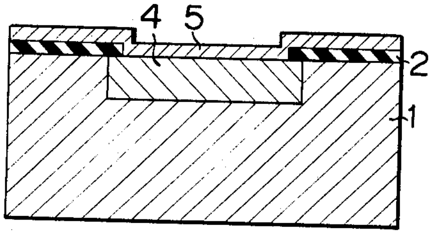

The semiconductor substrate 1 is not necessarily limited to an N-type conductivity but may assume a P-type conductivity. The reverse may also apply to the base region and later described emitter region. When there is formed a base region after perforation of an insulation film of silicon dioxide ($SiO_2$) used as a mask, there is unavoidably generated, as is known, on said base region a film of the same silicon dioxide ($SiO_2$) which is thinner than the surrounding $SiO_2$ insulation film. This thin $SiO_2$ film is removed by photo etching or other means. Said removal may be effected by chemical etching using a solution of, for example, hydrogen fluoride base. It is advisable for removal of said unnecessary oxide film to properly adjust the time of etching according to its thickness. After the surface of the base region is exposed by removal of said unnecessary $SiO_2$ film, there is vapour deposited, as shown in FIG. 2, a metal electrode layer 5 on the exposed surface of the base region and on the $SiO_2$ insulation film surrounding it so as to form the first or base electrode. The material of said metal electrode layer is suitably chosen depending on whether the subsequent formation of an emitter region is carried out by thermal diffusion or ion implantation. For example, where the emitter region is formed by thermal diffusion, there is required a metal capable of fully withstanding the temperature of heat treatment involved in said diffusion operation. When diffusion is conducted at a temperature of, for example, around 900°C, said electrode metal preferably consists of molybdenum or platinum. And where ion implantation is employed in forming the emitter region, the temperature used can be reduced to below 500°C, so that aluminum is available as said electrode metal. Also in this case, there can of course be used the aforesaid molybdenum or platinum. It will be noted, however, that when the electrode metal consists of aluminium, it sometimes melts into the base region depending on the temperature of heat treatment to adversely affect the properties of the resultant transistor.

Figure 3:
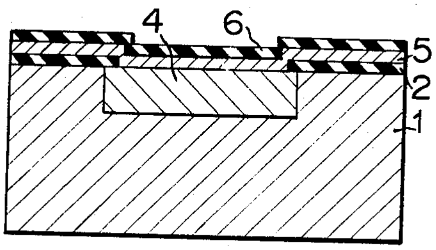
Figure 4:
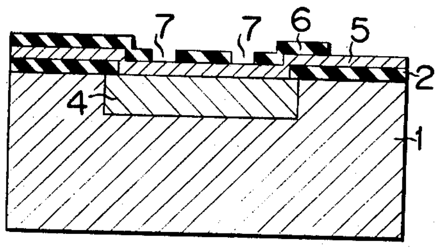
Figure 11A:
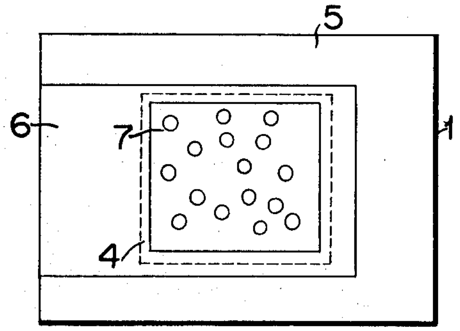
FIG. 11A is a plan view of a semiconductor device at the manufacturing step of FIG. 4.
Figure 11B:
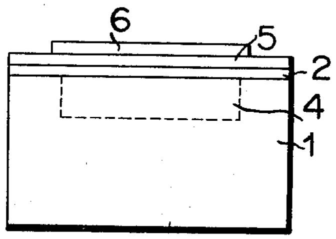
FIG. 11B is a left side view of FIG. 11A.

Next, as shown in FIG. 3 there is deposited on said metal electrode 5 a second insulation film 6, for example, a silicon dioxide film by thermal decomposition of silane ($SiH_4$) or other means. The insulation film 6 may also consist of silicon nitride ($Si_3N_4$) or alumina ($Al_2O_3$) and be mounted on said metal electrode 5 by sputtering. The insulation film 6 on the base region 4 is perforated as shown in FIG. 4, by photo etching with numerous minute holes 7 in the scattered form so as to expose the underlying metal electrode layer 5. At this time in addition to perforation of holes 7 in the insulation film 6, there is removed by photo etching said insulation film 6 formed on that part of a semiconductor substrate lying between the base region 4 and the right side wall of the semiconductor substrate 1 as shown in FIG. 4 and also part of the upper and lower end portions of said insulation film 6 as shown in FIG. 11A. For briefness of description, FIG. 4 only represents two holes 7 formed in the insulation film 6, but in practice they are provided in large numbers as shown in FIG. 11A. Said holes 7 may be shaped into any form such as circle, rectangle, square or triangle, and of course assume any combination of such forms. Further, the holes 7 do not have to be distributed in regular arrangement but scattered irregularly as shown in FIG. 11A.

Figure 5A:
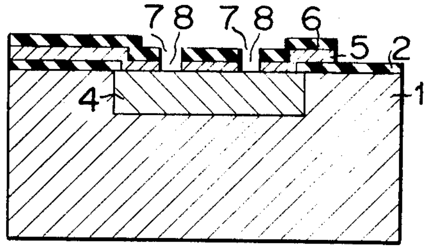
Figure 6A:
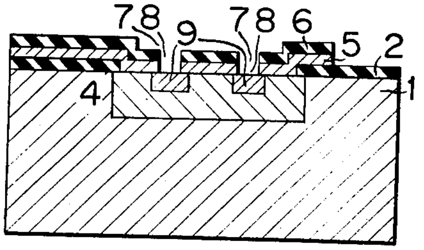
Figure 7A:
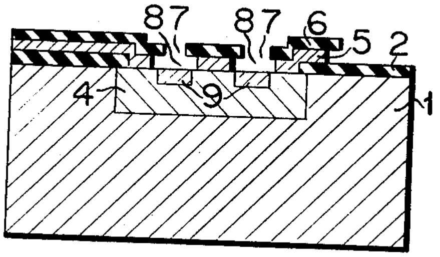
Figure 5B:
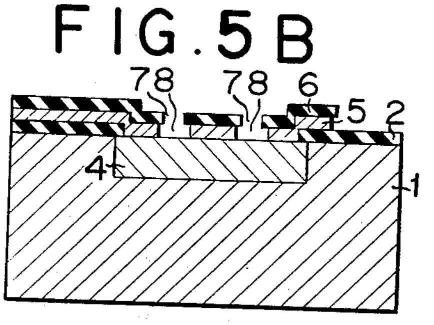
Figure 6B:
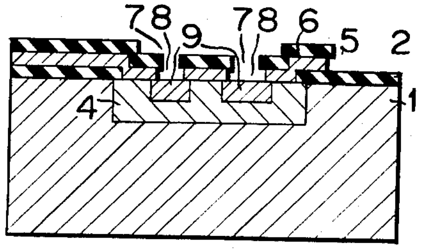
Figure 7B:
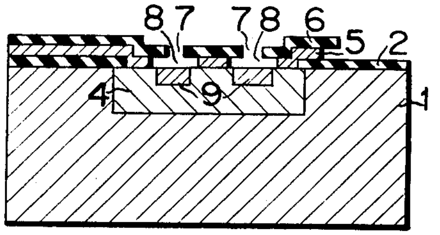

The partly removed insulation film 6 is used as a mask and the underlying metal electrode layer is etched by suitable etching process, for example, with an etching liquid which does not affect the insulation film 6. If, in this case, the electrode metal consists of aluminium, it is advisable to use an etching liquid of phosphate or caustic soda base. Where the electrode metal is molybdenum or platinum, the etching liquid used is preferred to be of sulfate or chlorate base. As shown in FIG. 5A, the exposed parts of the metal electrode layer 5 are removed and the surface of the underlying portions of the base region 4 is exposed through the holes 7 of the insulation film 6. Also the other exposed parts of the metal electrode layer 5 than in the base region 4 are removed. At these parts there is exposed the second insulation film 2. Depending on the time of etching, there are occasions where there are only removed the exposed parts of the electrode metal 5 as shown in FIG. 5A and where said electrode metal is overetched beyond said exposed parts as shown in FIG. 5B. The aforementioned operation produces holes 8 in the metal electrode layer 5 which communicate with the holes 7 of the insulation film 6. FIG. 5A represents the case where said hole 8 has substantially the same area as the hole 7 of the insulation film 6, and FIG. 5B the case where said hole 8 has a slightly larger area than said hole 7. At this stage, the aforesaid overetching is not always required, but is an indispensable step to the present invention as later described. As mentioned above, the surface of the base region 4 is exposed through the scattered minute holes 7 perforated in the insulation film 6. Into these exposed parts of the base region 4 are introduced by thermal diffusion or ion implantation impurities having an opposite type of conductivity to said base region 4 using the insulation film 6 as a mask so as to form a second or emitter region 9 consisting of numerous minute divided sections provided in scattered arrangement to a depth of about 0.5 micron as shown in FIGS. 6A and 6B. If shaped in a circular form, each of said numerous emitter sections 9 will be reduced to a minute area, for example, 0.5 to 2 microns in diameter. Therefore, a group of said numerous emitter sections 9 as a whole will prominently increase in its overall peripheral length with respect to its area. FIGS. 6A and 6B represent the case where there are formed said numerous emitter sections by diffusion for the same reason as is given in forming the base region 4. At the manufacturing stage shown in these figures, the metal electrode or base electrode 5 is connected to each section of the emitter region 9 formed, so that it is necessary to separate said electrode from the latter. To this end, the base electrode is overetched so as to separate it from the proximity of the emitter section 9 as shown in FIGS. 7A and 7B. The interval between the two is only required to be about 1 micron and can technically be made so.

The emitter sections 9 can also be formed by ion implantation. In this case each emitter section 9 has substantially the same area as the hole 7 of the insulation film 6. Where, therefore, there is formed by ion implantation. an emitter section 9 from the state of FIG. 5B, there is no need for overetching shown in FIG. 7B, because the hole 8 in the metal electrode layer 5 is already formed larger than the hole 7 of the insulation film 6. Again where there is formed by ion implantation an emitter section 9 from the state of FIG. 5A, it is necessary to separate the base electrode 5 from the emitter section 9 formed, so that there is required overetching shown in FIG. 7A. The distance between the periphery of the hole 8 of the base electrode 5 and that of the hole 7 of the insulation film 6 is only required to be about 1 micron.

Figure 8:
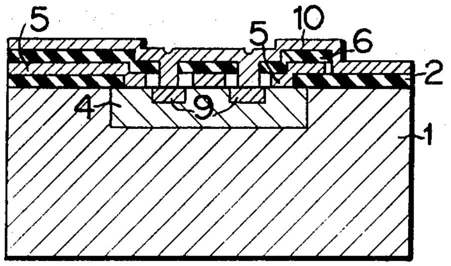

As shown in FIG. 8, there is vapour deposited on the insulation film 6 and silicon dioxide film 2 a second metal electrode or emitter electrode 10 of, for example, aluminium, molybdenum or platinum. Said second metal electrode 10 is electrically connected to the surface of the emitter section 9 through the hole 7 of the insulation film 6 and the hole 8 of the base electrode 5. Where there is vapour deposited a metal electrode layer 10 on the surface of the insulation film 6, then it will necessarily contact the emitter section 9, so that the manufacturing method of the present invention is saved from the difficult operation of aligning the emitter electrode with the hole 7 or 8 which unavoidably accompanied the prior art method, thus enabling each section of the emitter region 9 to be easily formed in an extremely minute size.

Figure 9:
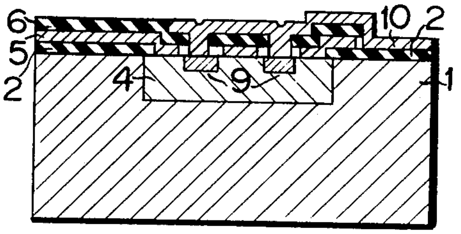
Figure 10:
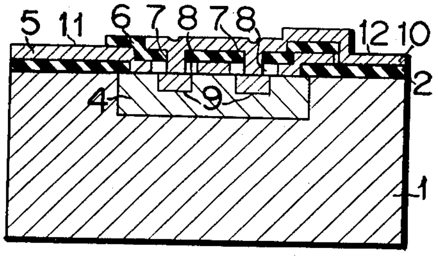
Figure 12A:
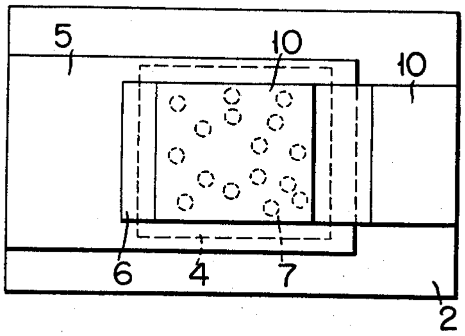
FIG. 12A is a plan view of a semiconductor device at the manufacturing step of FIG. 10.
Figure 12B:
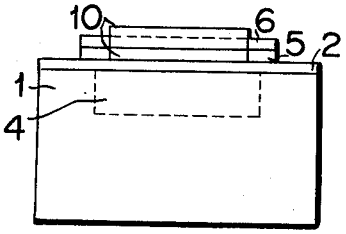
FIG. 12B is a right side view of FIG. 12A.

Thereafter, there is removed by photo etching part of the second metal electrode layer 10 on that portion of the base electrode 5 extending outside of the base region 4 as shown in FIG. 9 and also part of the upper and lower end portions of the second metal electrode layer 10 formed on the silicon dioxide film 2 as shown in FIG. 12A. Depending on the kind of metal used as said second electrode layer 10, there is selected a suitable one from among the aforementioned etching liquids. As shown in FIG. 10, part of the insulation film 6 on the base electrode 5 exposed by removal of the metal electrode layer 10 is eliminated by photo etching to expose part of the underlying base electrode 5. From the exposed surface 11 of the base electrode 5 is drawn a base leadout wire and an emitter leadout wire from the surface 12 of the emitter electrode 10. A transistor wherein the surface 12 of the emitter electrode 10 is not superposed on the base electrode 5 with the insulation film 6 interposed therebetween has the property of decreasing its input capacitance. The semiconductor substrate 1 constitutes the collector region of a transistor. The collector electrode (not shown) is connected, as is known, to the underside of the substrate 1. The base electrode 5 and emitter electrode 10 are mutually insulated on the base region 4 and silicon dioxide film 2 by a void space formed by said overetching and at other parts by the insulation film 6.

As is apparent from FIG. 10, the semiconductor device of the present invention is prepared by allowing electrodes connected to the respective regions of a single semiconductor element to be laminated on each other with an insulation film interposed therebetween and on this account is substantially different from the prior art integrated semiconductor circuit wherein the electrodes connected to the respective regions of different semiconductor elements are laminated on each other with an insulation film interposed therebetween.

With a semiconductor element manufactured by the aforesaid process, the required area of a base region is reduced to less than half of that used in the prior art semiconductor element with respect to the same area of an emitter region, and the ratio of the peripheral length to the area of the numerous minute divided sections of the emitter region as a whole is made more than ten times greater than is possible with the prior art, making prominent contribution to the improvement of the high frequency properties of a semiconductor element.

With a transistor for low power signals, there is formed in a base region an emitter region consisting of scores of divided sections whereas a high power transistor involves hundreds or thousands of such emitter sections, though the base region thereof is of course required to have a large area. Accordingly, even when some of said emitter sections are not used in actual operation, the properties of a transistor as a whole will not be substantially affected.

Figure 13:
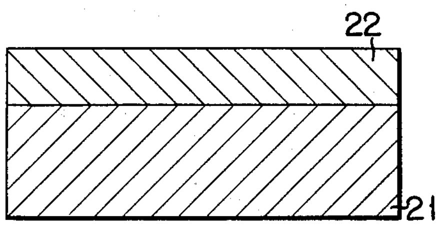

There will now be described the method of manufacturing an elongated field effect transistor according to the present invention. As shown in FIG. 13, there is formed by epitaxial growth a high resistance layer 22 of N-type conductivity on a low resistance silicon wafer 21 of $N^+$-type conductivity. In this case, both wafer 21 and epitaxial layer 22 may, of course, be of P-type conductivity.

Figure 16:
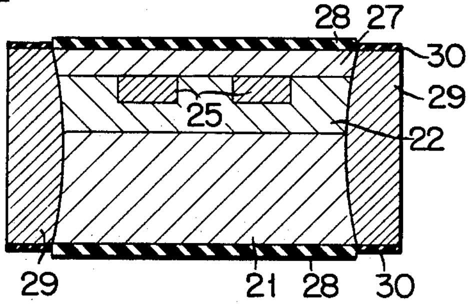
FIGS. 13 to 22 are schematic sectional views of a semiconductor device according to another embodiment of the invention, showing the sequential steps of its manufacture.
Figure 14:
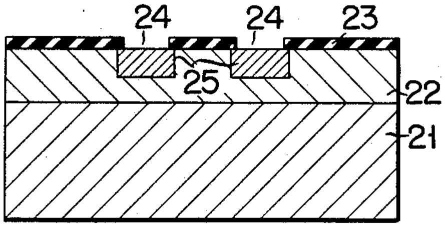
Figure 17:
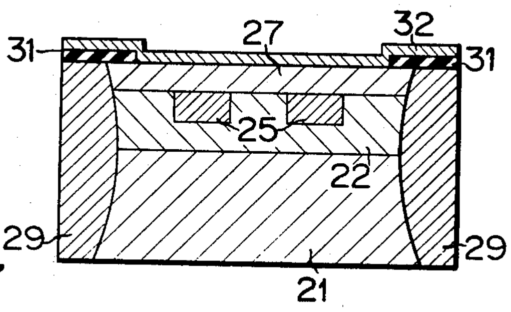
Figure 15:
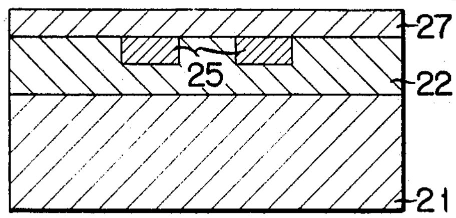
Figure 18:
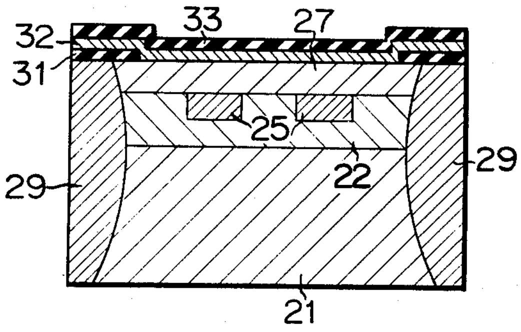
Figure 19:
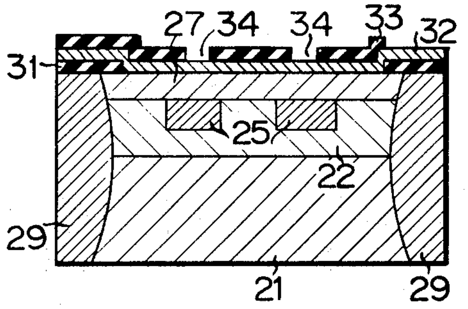
Figure 23:
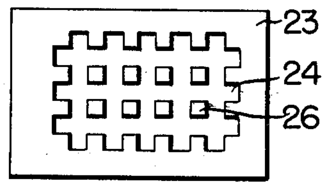
FIG. 23 is a plan view of a semiconductor device at the manufacturing step of FIG. 14.
Figure 24:
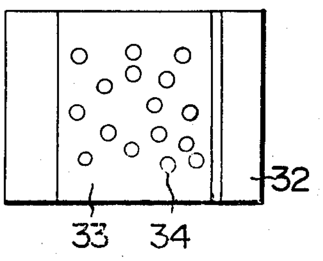
FIG. 24 is a plan view of a semiconductor device at the manufacturing step of FIG. 19.

On the surface of the epitaxial layer 22 is formed by a known process an insulation film 23, for example, an oxide film. On said insulation film 23 is selectively perforated, as shown in FIG. 23, a mask hole 24 in the lattice form by photo etching. Next as shown in FIG. 14, there are diffused P-type impurities in the epitaxial layer 22 through the hole 24 in lattice arrangement so as to form a first region 25. In this case, said first region 25 may, of course, be formed by ion implantation. The hole 24 in a lattice arrangement is formed in such a manner that one side of each hole has a width of about 3 microns and the distance between two opposite sides is also about 3 microns. It will be understood that FIG. 14 is more simplified than FIG. 23. The first region 25 is prepared in the lattice form in the epitaxial layer 22 and the region of N-type conductivity surrounded by the first region 25 acts as a channel. Said N-type region acting as a channel is indicated by numeral 26 in FIG. 23. The oxide film 23 on the surface of the epitaxial layer 22 is removed and there is formed, as shown in FIG. 15, by epitaxial growth a layer 27 of N-type conductivity on the epitaxial layer 22. This process causes said first region 25 in lattice arrangement to be embedded in the epitaxial layers 22 and 27. The wafer 21 and epitaxial layers 22 and 27 constitute a semiconductor substrate. Next, as shown in FIG. 16, there is deposited an oxide film 28 at the central part of the substrate with both end portions left out. From both sides of the substrate is selectively diffused an impurity in high concentration to form a region 29 of $P^+$-type conductivity. At the time of said diffusion there is unavoidably generated a thin oxide film on the surface of the region 29. Part of the surface of the epitaxial layer 27 is exposed either by removing the central portion of the aforementioned oxide films 28 and 30 or by removing the central portion of a fresh oxide film formed all over the surface of the substrate after elimination of said oxide films 28 and 30. As shown in FIG. 17, on the exposed surface of the epitaxial layer 27 as well as on a fresh oxide film 31 formed on both sides of the substrate, there is mounted a first metal electrode layer 32. In this case, said metal electrode layer consists of the same material as used in preparing a transistor. FIG. 17 represents the case where there is formed said fresh oxide film 31. On the first metal electrode layer 32 is deposited an insulation film 33 as shown in FIG. 18. This insulation film 33 also consists of the same material as used in preparing a transistor. In said insulation film 33 are formed, as shown in FIGS. 19 and 24, by photo etching numerous minute holes 34 in a manner to fall within an area where there are disposed said first region 25 in lattice arrangement. As in the case of forming a transistor, part of the insulation film 33 on the oxide film 31 is removed to exposed part of the first metal electrode layer 32. Where the minute holes 34 are formed in the insulation film 33, it is unnecessary to arrange them exactly above the first region 25. They may be irregularly distributed as illustrated in FIG. 24.

Figure 20:
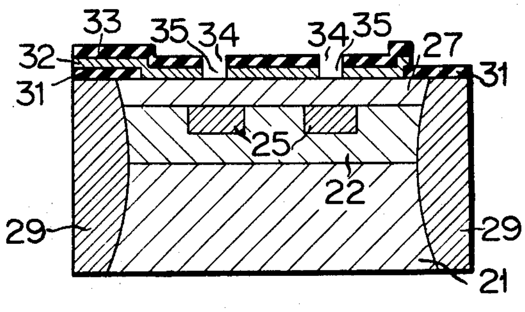

The first metal electrode layer 32 is partly etched, as shown in FIG. 20, using the insulation film 33 as a mask in the same manner as in forming a transistor so as to perforate holes 35 communicable with the holes 34 of the insulation film 33. At this time, the exposed parts of the first metal electrode layer 32 on the oxide film 31 are removed to expose the underlying portions of said oxide film 31. Perforation of holes 35 in the first metal electrode 32 exposes part of the epitaxial layer 27. Into the exposed parts of the epitaxial layer 27 is introduced by diffusion or ion implantation an impurity of the same type of conductivity as that of the first region 25 using the insulation film 33 as a mask so as to form a second region 36 in large number of divided sections, each of which has such a depth, for example, of one micron, as allows one end of its to be exposed to the surface of the substrate and the other end to contact the first region 25. The first region 25 assuming a lattice form is regularly distributed, whereas the divided sections of the second region 36 are scattered irregularly as are the holes 34 of the insulation film 33. Accordingly, some of said divided sections of the second region 36 may not contact the first region 25. Since, however, said sections are formed in large members, there is not raised any practical problem.

This means that there is no need to carry out the accurate alignment of the divided sections of the second region 36 with the first region 25 for their mutual connection, thus simplifying the process of manufacturing a semiconductor apparatus.

Figure 21:
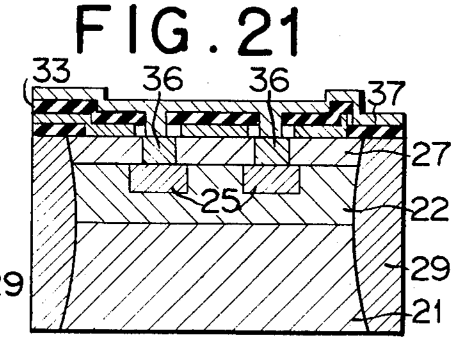
Figure 22:
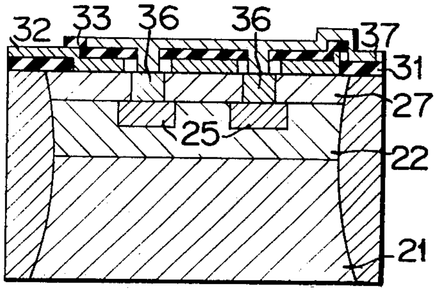

The holes 35 of the first metal electrode layer 32 are broadened using an etching liquid which will not affect the insulation film 33, so as to separate the first metal electrode layer 32 from the divided sections of the second region 36 for insulation. The second metal electrode layer 37 is vapour deposited on the insulation film 33 to be electrically connected to the divided sections of the second region 36 through the holes 34 of said insulation film 33 and those 35 of the first metal electrode layer 32. The first and second metal electrode layer 32 and 37 are electrically insulated from each other by an intervening void space. FIG. 21 represents a semiconductor device formed by the steps described up to this point. Exposure of the first metal electrode layer 32 on the oxide film 31 is carried out in the following manner. First, part of the second metal electrode layer 37 is removed by photo etching to expose part of the insulation film 33, and then part of said exposed portion of the insulation film 33 is similarly etched off finally to expose part of the first metal electrode layer 32 as shown in FIG. 22. These first and second metal electrode layers 32 and 37 have the same horizontal shapes as in forming a transistor. The first metal electrode layer 32 represents the source electrode of a field effect transistor and the second metal electrode layer 37 denotes the gate electrode of said transistor. As is known, the drain electrode (not shown) thereof is connected to the underside of the wafer 21.

Since the second region 25 consisting of numerous divided sections constitutes a gate region and assumes a lattice form, the aforementioned channels are provided in numerous minute forms, thus elevating the modulation efficiency of a field effect transistor.

It will be appreciated by those skilled in the art that the drawings are intended to illustrate the concepts of the present invention and are not to scale. Although the invention has been described with reference to particular preferred embodiments thereof, many changes and modifications will become apparent to those skilled in the art in view of the foregoing description which is intended to be illustrative and not limiting of the invention defined in the appended claims.

What is claimed is:

1. A method for manufacturing a semiconductor device comprising the steps of:

forming a first region of one conductivity type in a substrate having an opposite conductivity type to said first region through a main surface of said substrate;

vapor depositing a first metal electrode layer at least on said first region;

depositing an insulation film on said first electrode layer;

etching said insulation film over said first region with a plurality of relatively minute holes to expose said first metal electrode layer through said holes;

etching said first metal electrode layer with a plurality of holes to expose said first region through said holes of said insulation film and said etched holes of said first metal electrode layer;

forming in said first region a second region having an opposite conductivity type to said first region through said holes of said first metal electrode layer and insulation film;

overetching said holes of said first metal electrode layer to a location beyond the junction between the first and second regions so that they become larger than those of said insulation film after formation of said second region in said first region; and vapor depositing a second metal electrode layer on said insulation film so as to electrically connect it to each exposed section of said second region through said holes of said first metal electrode layer and insulation film.

2. A method as defined in claim 1 wherein the perforation of holes in said first metal electrode layer and insulation film comprises the steps of:

first, perforating said insulation film using an etching liquid in which said insulation film is soluble, but said first metal electrode layer is difficultly soluble; and then perforating said first metal electrode layer with holes in registration with those already formed in said insulation film, using an etching liquid in which said first metal electrode layer is soluble but said insulation film is difficultly soluble.

3. A method for manufacturing a semiconductor device comprising the steps of:

forming a first region of one conductivity type in a substrate having an opposite conductivity type to said first region through a main surface of said substrate;

vapor depositing a first metal electrode layer at least one said first region;

depositing an insulation film on said first electrode layer;

etching said insulation film over said first region with a plurality of relatively minute holes to expose said first metal electrode layer through said holes;

etching said first metal electrode layer with a plurality of holes to expose said first region through said holes of said insulation film and said etched holes of said insulation film and said etched holes of said first metal electrode layer such that said holes of said first metal electrode layer become larger than that of said insulation film;

forming by ion implantation in said first region a second region having an opposite conductivity type to said first region through said holes of said first metal electrode layer and insulation film; and vapor depositing a second metal electrode layer on said insulation film so as to electrically connect it to each exposed section of said second region through said holes of said first metal electrode layer and insulation film.

4. A method as defined in claim 3 wherein the perforation of holes in said first metal electrode layer and insulation film comprises the steps of:

first, perforating said insulation film using an etching liquid in which said insulation film is soluble, but said first metal electrode layer is difficultly soluble; and then perforating said first metal electrode layer with holes in registration with those already formed in said insulation film, using an etching liquid in which said first metal electrode layer is soluble but said insulation film is difficultly soluble.

* * * * *